United States Patent
Kolman et al.

(10) Patent No.: US 7,415,479 B2
(45) Date of Patent: *Aug. 19, 2008

(54) METHOD AND APPARATUS FOR ASSIGNING TEST NUMBERS

(75) Inventors: Robert S. Kolman, Longmont, CO (US); Reid Hayhow, La Porte, CO (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 506 days.

This patent is subject to a terminal disclaimer.

(21) Appl. No.: 10/839,887

(22) Filed: May 5, 2004

(65) Prior Publication Data

US 2005/0262079 A1 Nov. 24, 2005

(51) Int. Cl.
*G06F 17/30* (2006.01)
*G06F 7/00* (2006.01)
(52) U.S. Cl. .................. 707/101; 707/4; 707/104.1
(58) Field of Classification Search ................ 702/108, 702/119; 707/1, 101, 104.1
See application file for complete search history.

(56) References Cited

U.S. PATENT DOCUMENTS 6,425,121 B1 * 7/2002 Phillips ............... 717/109
2003/0188298 A1 * 10/2003 Shaposhnick ........... 717/141
2005/0102572 A1 * 5/2005 Oberlaender ............. 714/29

OTHER PUBLICATIONS

John Viescas, "Running Microsoft Access 2000", Microsoft Press, 1999, 8 pages.*

Robert S. Kolman, et al. "Method, Apparatus and Database Using a Map of Linked Data Nodes for Storing Test Numbers", Filed May 5, 2004, U.S. Patent Application (20 pages of specification, 5 sheets of drawings (Figs. 1-10).
Robert S. Kolman, et al. "Methods and Apparatus that Use Contextual Test Number Factors to Assign Test Numbers", Filed May 5, 2004, U.S. Patent Application (27 pages of specification, 8 sheets of drawings (Figs. 1-13).
Robert S. Kolman, et al. "Methods and Apparatus that Use Contextual Test Number Factors to Assign Test Numbers", Filed May 5, 2004, U.S. Patent Application (25 pages of specification, 7 sheets of drawings (Figs. 1-10).
Robert S. Kolman, et al. "Methods and Apparatus for Identifying Test Number Collisions", Filed May 5, 2004, U.S. Patent Application (22 pages of specification, 7 sheets of drawings (Figs. 1-10).
Robert S. Kolman, et al. "Methods and Apparatus for Handling Test Number Collisions", Filed May 5, 2004, U.S. Patent Application (28 pages of specification, 9 sheets of drawings (Figs. 1-11).

* cited by examiner

*Primary Examiner*—Hosain Alam
*Assistant Examiner*—Shew-Fin Lin
(74) *Attorney, Agent, or Firm*—Holland & Hart, LLP

(57) ABSTRACT

In a method for assigning test numbers, current testflow context information is maintained during execution of a testflow. Upon execution of a subtest in the testflow, a database of test numbers is indexed using index information comprising 1) an identifier of the subtest, and 2) the current testflow context information. If a test number corresponding to the index information exists in the database, the test number is assigned to a result of the subtest. If a test number corresponding to the index information does not exist in the database, a new test number is assigned to the result of the subtest, and the index information and new test number are associated in the database. A test number engine for satisfying calls for test numbers is also disclosed.

15 Claims, 6 Drawing Sheets

400

```
1    "AAA : Subtest1"
2    "AAA : Subtest2"
3    "AAA : Subtest3"
4    "BBB : L1 : Subtest1"
5    "BBB : L1 : Subtest2"
6    "BBB : L1 : Subtest3"
7    "CCC : L1 : L1 : Subtest1"
8    "CCC : L1 : L1 : Subtest2"
9    "CCC : L1 : L1 : Subtest3"
10   "CCC : L1 : L2 : Subtest1"
11   "CCC : L1 : L2 : Subtest2"
12   "CCC : L1 : L2 : Subtest3"
13   "CCC : L1 : L3 : Subtest1"
14   "CCC : L1 : L3 : Subtest2"
15   "CCC : L1 : L3 : Subtest3"
16   "BBB : L2 : Subtest1"
17   "BBB : L2 : Subtest2"
18   "BBB : L2 : Subtest3"
19   "CCC : L2 : L1 : Subtest1"
20   "CCC : L2 : L1 : Subtest2"
21   "CCC : L2 : L1 : Subtest3"
22   "CCC : L2 : L2 : Subtest1"
23   "CCC : L2 : L2 : Subtest2"
24   "CCC : L2 : L2 : Subtest3"
25   "CCC : L2 : L3 : Subtest1"
26   "CCC : L2 : L3 : Subtest2"
27   "CCC : L2 : L3 : Subtest3"
28   "BBB : L3 : Subtest1"
29   "BBB : L3 : Subtest2"
30   "BBB : L3 : Subtest3"
31   "CCC : L3 : L1 : Subtest1"
32   "CCC : L3 : L1 : Subtest2"
33   "CCC : L3 : L1 : Subtest3"
34   "CCC : L3 : L2 : Subtest1"
35   "CCC : L3 : L2 : Subtest2"
36   "CCC : L3 : L2 : Subtest3"
37   "CCC : L3 : L3 : Subtest1"
38   "CCC : L3 : L3 : Subtest2"
39   "CCC : L3 : L3 : Subtest3"
```

```
"AAA"
"L1"
"BBB : L1"
"L1 : L1"
"CCC : L1 : L1"
"L1 : L2"
"CCC : L1 : L2"
"L1 : L3"
"CCC : L1 : L3"
"L2"
"BBB : L2"
"L2 : L1"
"CCC : L2 : L1"
"L2 : L2"
"CCC : L2 : L2"
"L2 : L3"
"CCC : L2 : L3"
"L3"
"BBB : L3"
"L3 : L1"
"CCC : L3 : L1"
"L3 : L2"
"CCC : L3 : L2"
"L3 : L3"
"CCC : L3 : L3"
```

| | |
|---|---|
| 1 | "pass" |
| 2 | "pass" |
| 3 | "pass" |
| 4 | "pass" |
| 5 | "fail" |
| 6 | "pass" |
| 7 | "pass" |
| 8 | "pass" |
| 9 | "pass" |
| 10 | "pass" |
| 11 | "pass" |
| 12 | "pass" |
| 13 | "pass" |
| 14 | "pass" |
| 15 | "pass" |
| 16 | "pass" |
| 17 | "pass" |
| 18 | "pass" |
| 19 | "pass" |
| 20 | "pass" |
| 21 | "pass" |
| 22 | "pass" |
| 23 | "pass" |
| 24 | "pass" |
| 25 | "pass" |
| 26 | "pass" |
| 27 | "pass" |
| 28 | "pass" |
| 29 | "pass" |
| 30 | "pass" |
| 31 | "pass" |
| 32 | "pass" |
| 33 | "pass" |
| 34 | "fail" |
| 35 | "fail" |
| 36 | "fail" |
| 37 | "pass" |
| 38 | "pass" |
| 39 | "pass" |

"AAA"
"L1"
"DDD : L1"
"BBB : L1"
"L1 : L1"
"CCC : L1 : L1"
"L1 : L2"
"CCC : L1 : L2"
"L1 : L3"
"CCC : L1 : L3"
"L2"
"DDD : L2"
"BBB : L2"
"L2 : L1"
"CCC : L2 : L1"
"L2 : L2"
"CCC : L2 : L2"
"L2 : L3"
"CCC : L2 : L3"
"L3"
"DDD : L3"
"BBB : L3"
"L3 : L1"
"CCC : L3 : L1"
"L3 : L2"
"CCC : L3 : L2"
"L3 : L3"
"CCC : L3 : L3"

FIG. 7

| | |
|---|---|
| 1 | "AAA : Subtest1" |
| 2 | "AAA : Subtest2" |
| 3 | "AAA : Subtest3" |
| 4 | "BBB : L1 : Subtest1" |
| 5 | "BBB : L1 : Subtest2" |
| 6 | "BBB : L1 : Subtest3" |
| 7 | "CCC : L1 : L1 : Subtest1" |
| 8 | "CCC : L1 : L1 : Subtest2" |
| 9 | "CCC : L1 : L1 : Subtest3" |
| 10 | "CCC : L1 : L2 : Subtest1" |
| 11 | "CCC : L1 : L2 : Subtest2" |
| 12 | "CCC : L1 : L2 : Subtest3" |
| 13 | "CCC : L1 : L3 : Subtest1" |
| 14 | "CCC : L1 : L3 : Subtest2" |
| 15 | "CCC : L1 : L3 : Subtest3" |
| 16 | "BBB : L2 : Subtest1" |
| 17 | "BBB : L2 : Subtest2" |
| 18 | "BBB : L2 : Subtest3" |
| 19 | "CCC : L2 : L1 : Subtest1" |
| 20 | "CCC : L2 : L1 : Subtest2" |
| 21 | "CCC : L2 : L1 : Subtest3" |
| 22 | "CCC : L2 : L2 : Subtest1" |
| 23 | "CCC : L2 : L2 : Subtest2" |
| 24 | "CCC : L2 : L2 : Subtest3" |
| 25 | "CCC : L2 : L3 : Subtest1" |
| 26 | "CCC : L2 : L3 : Subtest2" |
| 27 | "CCC : L2 : L3 : Subtest3" |
| 28 | "BBB : L3 : Subtest1" |
| 29 | "BBB : L3 : Subtest2" |
| 30 | "BBB : L3 : Subtest3" |
| 31 | "CCC : L3 : L1 : Subtest1" |
| 32 | "CCC : L3 : L1 : Subtest2" |
| 33 | "CCC : L3 : L1 : Subtest3" |
| 34 | "CCC : L3 : L2 : Subtest1" |
| 35 | "CCC : L3 : L2 : Subtest2" |
| 36 | "CCC : L3 : L2 : Subtest3" |
| 37 | "CCC : L3 : L3 : Subtest1" |
| 38 | "CCC : L3 : L3 : Subtest2" |
| 39 | "CCC : L3 : L3 : Subtest3" |
| 40 | "DDD : L1 : Subtest1" |
| 41 | "DDD : L1 : Subtest2" |
| 42 | "DDD : L1 : Subtest3" |
| 43 | "DDD : L2 : Subtest1" |
| 44 | "DDD : L2 : Subtest2" |
| 45 | "DDD : L2 : Subtest3" |
| 46 | "DDD : L3 : Subtest1" |
| 47 | "DDD : L3 : Subtest2" |
| 48 | "DDD : L3 : Subtest3" |

FIG. 8

METHOD AND APPARATUS FOR ASSIGNING TEST NUMBERS

BACKGROUND OF THE INVENTION

Some forms of circuit test provide an engineer with large volumes of test results. To assist the engineer in managing and referring to these test results, each test result may be associated with a test number. Test numbers aid the engineer in distinguishing one test result from another, and may sometimes assist the engineer in identifying the test that generated the result. Sometimes, an engineer may use test numbers to categorize or group particular test results, such as by assigning "500 series" test numbers to all Leakage tests. Typically, however, such categorized or grouped test numbers have to be assigned manually.

Sometimes, test numbers may be generated automatically, with each new test result being assigned a next sequential test number. However, if the same set of tests is executed multiple times, but certain tests are skipped on some runs because, for example, different test conditions are met, then it is possible that different executions of the same test will result in different test numbers being associated with the test results of that test. In addition, it is sometimes possible that a test control (e.g., a test method, test function or user procedure) will produce a plurality of test results. It is desirable to be able to identify which "subtest" produced which result, since the different results may have been generated under different conditions. However, past test numbering systems have typically assigned the same test number to each of these results, or have assigned different "automatic" test numbers, which have not possessed any implied informational value, and have sometimes skewed the relationships between later generated test results and their test numbers.

SUMMARY OF THE INVENTION

One aspect of the invention is embodied in a method for assigning test numbers. In accordance with the method, current testflow context information is maintained during the execution of a testflow. Upon execution of a subtest in the testflow, a database of test numbers is indexed using index information comprising 1) an identifier of the subtest, and 2) the current testflow context information. If a test number corresponding to the index information exists in the database, the test number is assigned to a result of the subtest. If a test number corresponding to the index information does not exist in the database, a new test number is assigned to the result of the subtest, and the index information and new test number are associated in the database.

Another aspect of the invention is embodied in a test number engine. The test number engine comprises computer readable media, and program code that is stored on the computer readable media. The program code comprises code to, in response to a call for a test number, index a database of test numbers using index information comprising 1) an identifier of a subtest, and 2) current testflow context information. The program code further comprises code to, upon retrieving a test number from the database, satisfy the call by returning the test number. In addition, the program code comprises code to, upon a miss in indexing the database, generate a new test number; satisfy the call by returning the new test number; and associate the index information and new test number in the database.

Other embodiments of the invention are also disclosed.

BRIEF DESCRIPTION OF THE DRAWINGS

Illustrative and presently preferred embodiments of the invention are illustrated in the drawings, in which:

FIG. 3 illustrates a progression of testflow context information for the FIG. 2 testflow;

FIG. 4 illustrates a database of test numbers that may be generated in response to execution of the FIG. 2 testflow;

FIG. 7 illustrates a progress of testflow context information for the FIG. 6 testflow;

FIG. 8 illustrates modifications to the database of test numbers shown in FIG. 4, after execution of the FIG. 6 testflow.

DESCRIPTION OF THE PREFERRED EMBODIMENT

Figure 1:
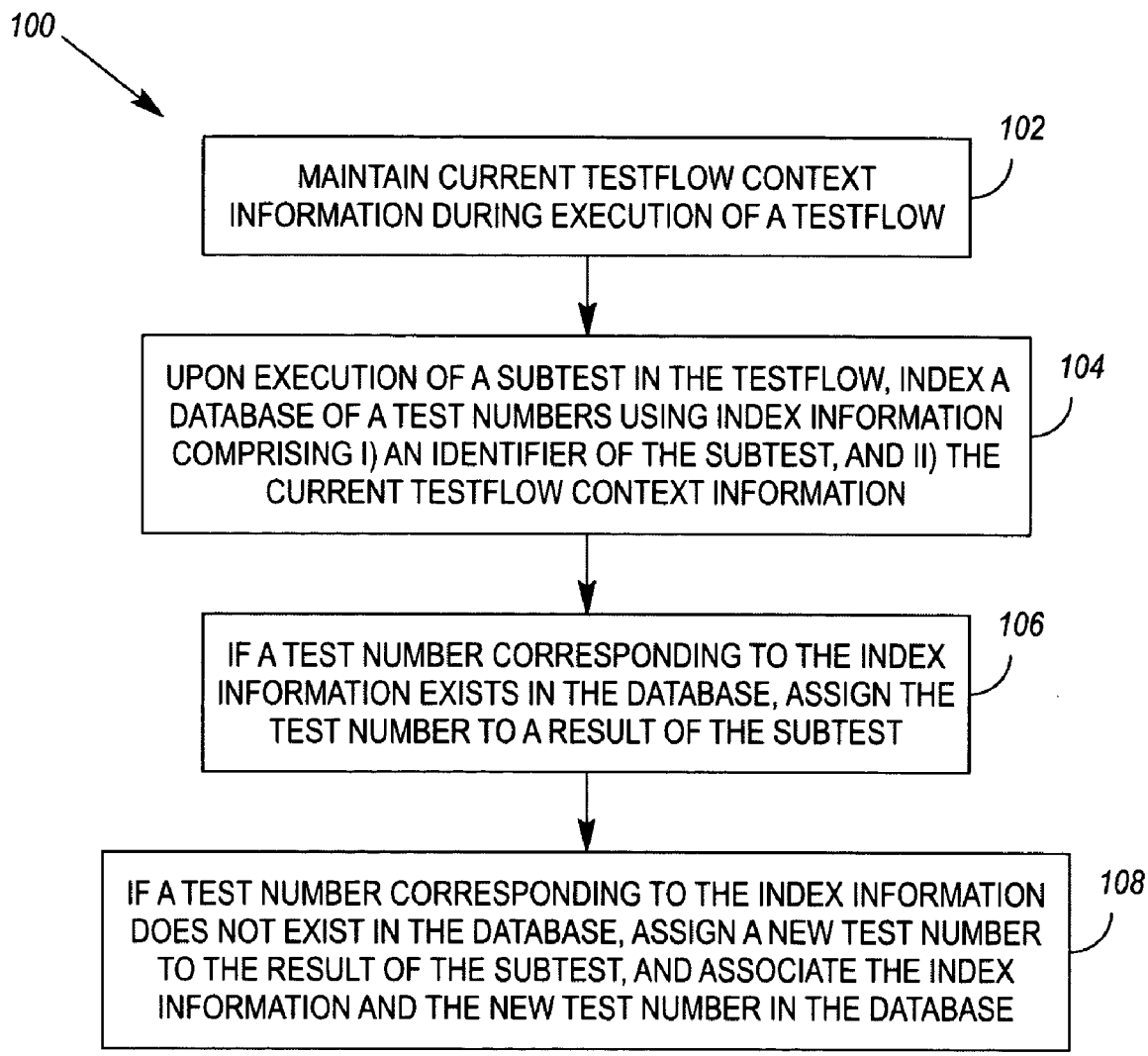
FIG. 1 illustrates an exemplary method for assigning test numbers.

FIG. 1 illustrates a method 100 for assigning test numbers. In accordance with the method 100, current testflow context information is maintained 102 during the execution of a testflow. As defined herein, a "testflow" is any portion of a test program that is used to specify the type, number or order of tests that may be executed during circuit test. Testflow context information may comprise any information that assists in defining what portion of a test program is being executed. By way of example, testflow context information may comprise information such as a test suite designator, a port designator, a vector label, a vector designator, or a pin designator. Testflow context information may also comprise a loop designator and/or loop iteration designator for each of a number of loop layers (e.g., nested loops) that have been entered during execution of a testflow. As used herein, the term "designator" encompasses a string, number or any other means that can be used to designate a test suite, loop or other testflow context.

Figure 2:
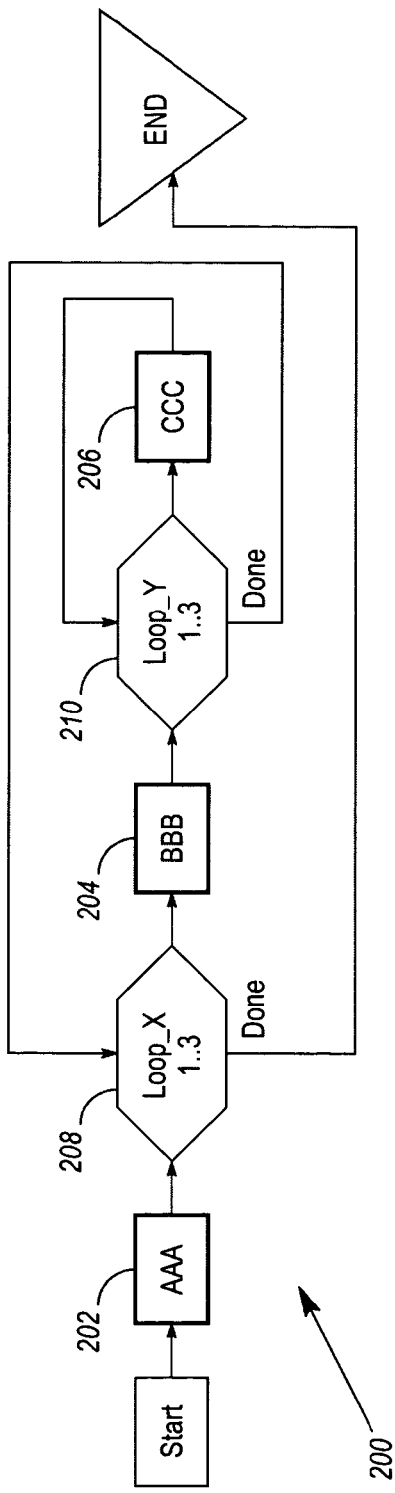
FIG. 2 illustrates an exemplary testflow.

FIG. 2 illustrates an exemplary testflow 200 for which testflow context information may be maintained. By way of example, the testflow 200 could be a system-on-a-chip testflow of the Agilent 93000 SOC Series tester (manufactured by Agilent Technologies, Inc. of Palo Alto, Calif., USA). The testflow 200 comprises three test suites 202, 204, 206, respectively named AAA, BBB and CCC. Each of the test suites 202-206 serves to contain and/or specify a number of subtests, and may include one or more test controls (e.g., test methods, test functions or user procedures). The testflow 200 also comprises two loops 208, 210, respectively named Loop_X and Loop_Y. By way of example, each loop 208, 210 specifies its loop is to be iterated three times (i.e., 1.3).

FIG. 3 illustrates a progression of testflow context information 300 that may be maintained by the method 100 during execution of the testflow 200. Note that the initial testflow context 302 is merely "AAA", or the name of the first encountered test suite. After the test suite AAA has been executed, the testflow context then changes to "L1", which is indicative of the first iteration of Loop_X.

Upon entry into the test suite BBB, the testflow context then changes to "BBB:L1". Note that, for ease of reading, the testflow contexts shown in FIG. 3 adopt the convention of always placing the current test suite's name at the beginning of the context. However, this is certainly not required by the method 100, and need not be done.

Upon first entering Loop_Y, the testflow context changes to "L1:L1". The identities of Loop_X and Loop_Y are therefore inferred from the number and order of loop iterations maintained in the testflow context. However, the identities of the loops could also be called out with specificity, such as by noting the context as "X1:Y1".

During execution of a testflow, one or more subtests will eventually be executed. A "subtest", as defined herein, may be a test that produces multiple test results, but is preferably a test or portion of a test that produces only a single test result.

Upon execution of a subtest, the method 100 continues with the indexing 104 of a database of test numbers using index information comprising 1) an identifier of the subtest, and 2) the current testflow context information. If a test number corresponding to the index information exists in the database, the test number is assigned 106 to a result of the subtest. If a test number corresponding to the index information does not exist in the database, a new test number is assigned 108 to the result of the subtest, and the index information and new test number are associated in the database.

Figure 5:
FIG. 5 illustrates a database of test results that may be generated in response to execution of the FIG. 2 testflow.

Assume now that each of the test suites 202-206 shown in FIG. 2 comprises three subtests, identified as Subtest1, Subtest2, and Subtest3. Note that although subtests of the same name may appear in each of the test suites 202-206, they need not be (and likely will not be) the same subtest. Upon execution of the first subtest in the testflow 200, index information comprising an identifier of the subtest (Subtest1) and the current testflow context information (AAA) is used to index a database of test numbers. If this is the first execution of the testflow 200, the database will be empty, and a new test number (e.g., 1) will be assigned to the result of Subtest1. The new test number (1) and index information (AAA: Subtest1) will also be associated in the database. During the first execution of the testflow 200, these steps continue, with the use of each successive index resulting in a database "miss", thereby causing a new test number and its associated index information to be added to the database. Thus, after a first execution of the testflow 200, the database of test numbers 400 shown in FIG. 4 may have been created. At the same time, each newly created test number will be assigned to a test result of its corresponding subtest, thereby resulting in the database of test results 500 shown in FIG. 5. Although the test results shown in FIG. 5 are all presented in terms of "pass" or "fail", the test results of an actual test run could also or alternately comprise voltage readings, current readings, impedance measurements, and other sorts of test results.

After execution of the testflow 200, the database of test numbers 400 and database of test results 500 may both be stored. In this manner, the test numbers in the database 400 persist from test run to test run. During a subsequent testflow execution, test numbers may then be drawn from and/or added to the database 400. If the subsequently executed testflow is testflow 200, the test numbers that are associated with the results of the testflow's subtests will be the same test numbers that were previously associated with the results of the testflow's subtests. If, for example, conditional instructions within a test suite cause certain ones of its subtests to be skipped during the second execution of the testflow 200, those subtests that are executed will still be assigned the same test numbers that they were assigned during the previous execution of the testflow 200. That is, test numbers are not merely assigned on an "order of execution" basis, but are rather assigned on a "contextual" basis.

Figure 6:
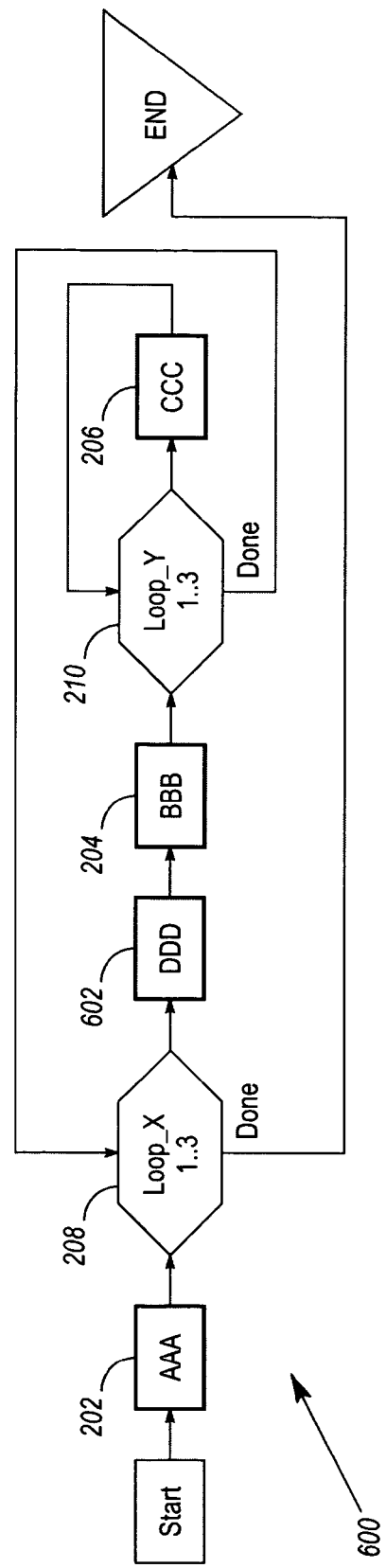
FIG. 6 illustrates an edited version of the FIG. 2 testflow.

Now consider the possibility of an edit to the testflow 200. The testflow 600 shown in FIG. 6 is an edited version of the testflow 200 shown in FIG. 2, the edit being the addition of a new test suite 602 named DDD. The progression of testflow contexts 700 for the testflow 600 is shown in FIG. 7. During execution of the edited testflow 600, the same test numbers will be assigned to the same subtests, and new subtests will be assigned new test numbers. The new test numbers (e.g., test numbers 40-48) are then added to the database 400 as shown in FIG. 8. Thus, even though two testflows 200, 600 differ, comparison of their test results is an easy task. Other edits to the testflow 200 are also possible (e.g., changing the order of test suites). However, moving a test suite into or out of a loop will change its context, and therefore cause the test suite to be associated with a different context (or contexts) upon subsequent executions of the testflow 200. A testflow that executes within a different context will therefore cause new test numbers to be added to the database 400.

Preferably, each of the subtests within a test suite is provided a unique subtest name, and enough testflow context information is maintained to ensure that each index into a database of test numbers forms a unique subtest identifier. It is also preferred that each new test number entered into the database is unique from all other test numbers in the database. However, the method 100 can often provide useful test numbers even when the above controls are not maintained.

Figure 9:
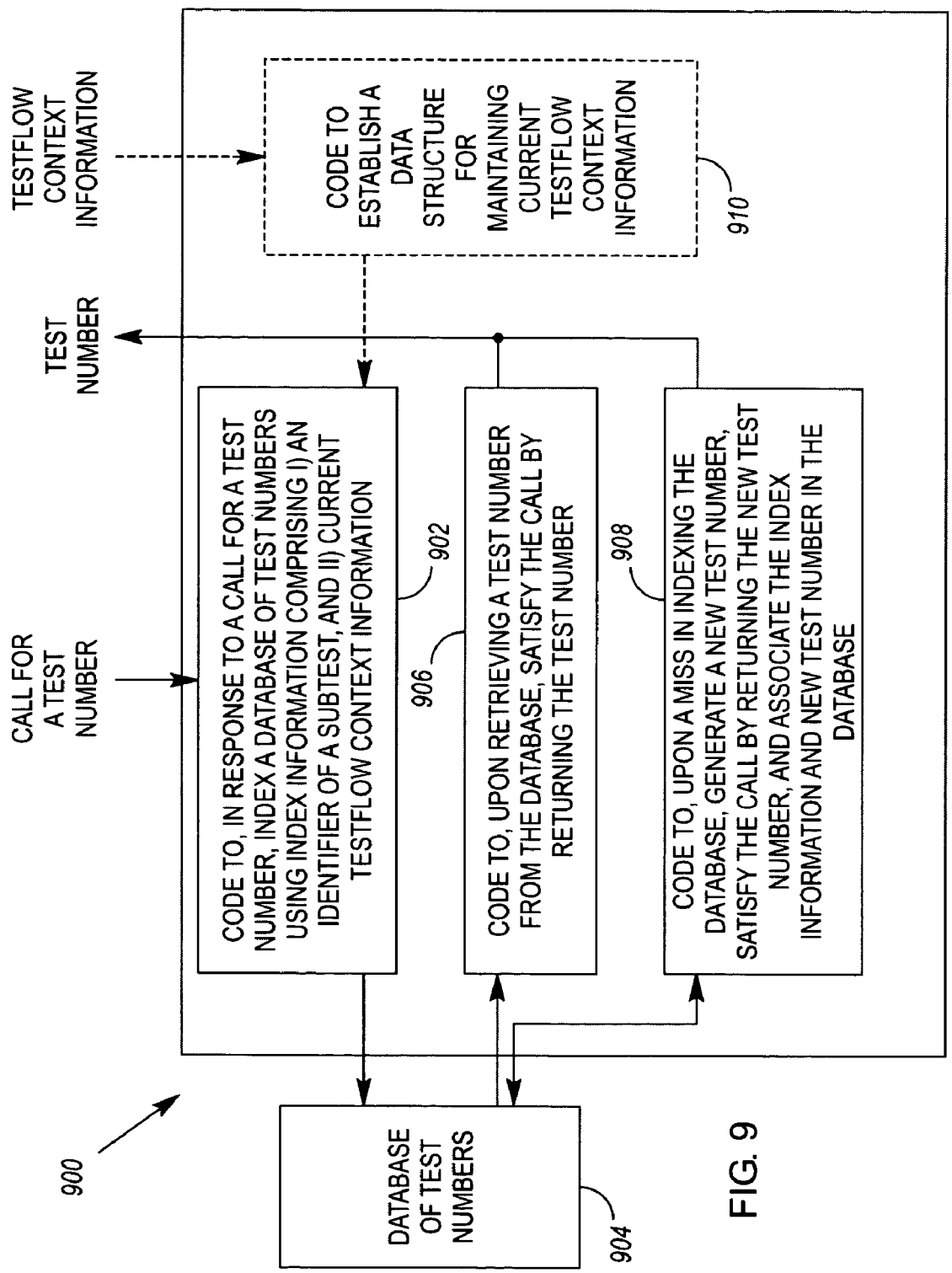
FIG. 9 illustrates an exemplary test number engine for returning test numbers in response to a call for same.

FIG. 9 illustrates a test number engine 900 that, by way of example, can be used to implement the method 100. The test number engine 900 is embodied in program code stored on computer readable media (e.g., a magnetic or optical disk, a fixed or removable disk, or random access or read-only memory (RAM or ROM)). In some embodiments, the program code of the test number engine 900 may be distributed among various computer readable media associated with one or a plurality of computer systems.

As shown, the test number engine 900 may comprise code 902 to, in response to a call for a test number, index a database of test numbers 904 using index information comprising 1) an identifier of a subtest, and 2) current testflow context information. The test number engine 900 may also comprise code 906 to, upon retrieving a test number from the database 904, satisfy the call by returning the test number. The test number engine 900 may further comprise code 908 to, upon a miss in indexing the database 904, generate a new test number, satisfy the call by returning the new test number, and associate the index information and new test number in the database. Optionally, the test number engine 900 could also comprise code 910 to establish a data structure for maintaining the current testflow context information.

The method 100 and test number engine 900 may maintain current testflow context information in a number of ways. One way to do so is push a new testflow context into a data structure (e.g., via a "Push( )" operation) each time a new testflow context is entered. Upon leaving a testflow context, the testflow context may then be popped from the data structure (e.g., via a "Pop( )" operation). Testflow context information may therefore be maintained similarly to a data stack. However, some entries in the data structure may need to be incremented or otherwise manipulated. For example, upon repeated entry into a loop, context information for the loop (e.g., a loop iteration number) may need to be incremented.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A computer-implemented method, comprising:

during execution of a testflow, maintaining current testflow context information;

upon execution of a subtest in the testflow, indexing a database of test numbers using index information comprising i) an identifier of the subtest, and ii) the current testflow context information, and when a test number corresponding to the index information exists in the database, assigning the test number to a result of the subtest;

when a test number corresponding to the index information does not exist in the database, assigning a new test number to the result of the subtest, and associating the index information and the new test number in the database;

outputting a first set of numbered test results, including the result of the subtest and its assigned test number;

during execution of a subsequent testflow, maintaining current testflow context information;

using the database, repeating said indexing step, said assigning step, and said associating step in a context of the subsequent testflow; and outputting a second set of numbered test results, wherein when a particular subtest is executed in a same context in both the testflow and the subsequent testflow, results of the particular subtest are assigned a same test number in each of the first and second sets of numbered test results.

2. The method of claim 1, wherein said index information forms a unique test identifier.

3. The method of claim 1, wherein said new test number is unique from all other test numbers in the database.

4. A computer-implemented method, comprising:

during execution of a testflow, maintaining current testflow context information;

upon execution of a subtest in the testflow, indexing a database of test numbers using index information comprising i) an identifier of the subtest, and ii) the current testflow context information, and when a test number corresponding to the index information exists in the database, assigning the test number to a result of the subtest;

when a test number corresponding to the index information does not exist in the database, assigning a new test number to the result of the subtest, and associating the index information and the new test number in the database;

storing said database of test numbers; and drawing test numbers from said database during a subsequent testflow execution, wherein if a particular subtest is executed in a same context in both the testflow and the subsequent testflow, results of the particular subtest are assigned a same test number.

5. The method of claim 1, wherein the testflow is a system-on-a-chip testflow.

6. The method of claim 1, wherein said testflow context information comprises a test suite designator.

7. The method of claim 1, wherein said testflow context information comprises a loop iteration designator.

8. The method of claim 1, wherein said testflow context information comprises a loop iteration designator for each of a number of loop layers.

9. The method of claim 1, wherein said testflow context information comprises at least one of: a port designator, a vector label, a vector designator, and a pin designator.

10. The method of claim 1, wherein maintaining current testflow context information comprises:

upon entering a given testflow context, pushing the given testflow context into a data structure; and upon leaving the given testflow context, popping the given testflow context from the data structure.

11. The method of claim 1, wherein maintaining current testflow context information comprises:

upon repeated entry into a loop during execution of the testflow, incrementing context information for the loop.

12. An apparatus, comprising:

a physical computer readable storage media; and program code, stored on said physical computer readable storage media, comprising:

code to cause a computer to, in response to a call for a test number, index a database of test numbers using index information comprising i) an identifier of a subtest, and ii) current testflow context information;

code to cause a computer to, when a test number corresponding to the index information exists in the database, retrieve a test number from the database and satisfy the call by returning the test number;

code to cause a computer to, upon a miss in indexing the database, generate a new test number, satisfy the call by returning the new test number, and associate the index information and new test number in the database; and code to cause a computer to store the database in persistent storage, and to access the database during subsequent testflow executions, to assign same test numbers to results of same subtests executed in same testflow contexts.

13. The apparatus of claim 12, wherein the program code further comprises code to establish a data structure for maintaining said current testflow context information.

14. The apparatus of claim 13, wherein the program code further comprises code to, in response to an executing testflow re-entering a loop, incrementing a loop iteration number of said current testflow context information.

15. The apparatus of claim 13, wherein the program code further comprises code to i) push new testflow contexts into said data structure, and ii) pop exited testflow contexts from said data structure.

* * * * *